United States Patent
Yamanaka

(10) Patent No.: US 6,744,261 B2
(45) Date of Patent: Jun. 1, 2004

(54) METHOD AND AN APPARATUS FOR MEASURING THE RATIO OF THE AMPLIFICATION FACTOR OF A SIGNAL LEVEL NORMALIZER

(75) Inventor: Haruhiko Yamanaka, Hyogo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 7 days.

(21) Appl. No.: 10/114,149

(22) Filed: Apr. 2, 2002

(65) Prior Publication Data
US 2002/0175688 A1 Nov. 28, 2002

(30) Foreign Application Priority Data
Apr. 2, 2001 (JP) .................................. 2001-103363

(51) Int. Cl.[7] .............................................. G01R 27/28
(52) U.S. Cl. ...................................... 324/616; 324/613
(58) Field of Search ........................... 324/126, 207.12, 324/613, 616; 350/282; 341/116, 138; 356/41

(56) References Cited

U.S. PATENT DOCUMENTS 3,815,124 A * 6/1974 Brewer ........................ 341/160
5,684,480 A * 11/1997 Jansson ....................... 341/139
5,963,161 A * 10/1999 Londei et al. ............... 341/163
6,249,189 B1 * 6/2001 Wu et al. ....................... 331/18

FOREIGN PATENT DOCUMENTS

| JP | 5-29937 | 5/1993 |
| JP | 5-343994 | 12/1993 |

* cited by examiner

Primary Examiner—N. Le
Assistant Examiner—Walter Benson

(57) ABSTRACT

An apparatus and method of determining the ratio of an amplification factor before and after changing the amplification factor of a signal normalizer that amplifies the voltage amplitude of signals input from a signal generator so that it stays within a predetermined range, and an alternating-current voltage determination device, including, reversing the phase relationship so that said sine-wave signals are negated, the output voltage amplitude of the signal generator stays within a predetermined range and the step wherein the changing the amplification factor of the signal normalizer and the output voltage amplitude of the signal generator so that they are inversely proportional and a difference is obtained between the output voltage amplitude of the signal normalizer before and after the change.

13 Claims, 5 Drawing Sheets

SIGNAL GENERATOR

SIGNAL NORMALIZER

ADC

10

13  12  11

PRIOR ART

FIG. 1

METHOD AND AN APPARATUS FOR MEASURING THE RATIO OF THE AMPLIFICATION FACTOR OF A SIGNAL LEVEL NORMALIZER

BACKGROUND OF THE INVENTION

1. Field of the Invention

The present invention pertains to a method and a device for determining the relative value (ratio) of the amplification factor before changing and after changing the amplification factor of a signal normalizer, and in particular, relates to a method and a device for determining the ratio of the amplification factor of a signal normalizer used in determination devices in order to improve the determination accuracy.

2. Discussion of the Background Art

The method whereby an analog-digital converter (A/D converter hereafter) is set up as an alternating-current voltage determination device and after the signals that are the subject of determination have been converted to discrete values, the signal components of the desired frequency are calculated by numeric operation, which is widely used as a method of determining the voltage amplitude of alternating-current signals that are the subject of determination in determination devices such as alternating-current voltammeters and LCR meters, etc. Determination errors in this case are attributed mainly to quantization errors, linearity errors due to bit weighting errors, and thermal noise, and there is particularly an increase in errors when the voltage amplitude of a signal that is input to the A/D converter is small. For example, errors of as much as 108 ppm are produced when signals are input where the maximum input voltage to an A/D converter with an accuracy of 18 bits is $\frac{1}{10}^{th}$ the full-scale voltage of the A/D converter. On the other hand, as a result of the increased accuracy needed for components that are the subject of determination, etc., the determination accuracy of the above-mentioned LCR meter must be 10 ppm or less when determining the alternating-current signal amplitude.

The method whereby a voltage converter that raises or lowers the signal voltage by a predetermined ratio is set up in front of the A/D converter and fluctuations in the voltage amplitude of signals that are input to the A/D converter are kept within a predetermined range in order to reduce the effects of linearity errors is a method for reducing the effects of linearity errors of the A/D converter on the determination values when determining the voltage amplitude of input signals within a broad voltage range. If the voltage amplitude of the signals that are the subject of determination is large enough, it is directly determined by an A/D converter, while if this voltage amplitude is so small that it will cause linearity errors of the A/D converter, voltage conversion by a voltage converter is performed on the signals that are the subject of determination. The voltage amplitude of the signals that are the subject of determination during voltage conversion can be obtained by multiplying the voltage amplitude of the signals input from the voltage converter to the A/D converter as determined by the A/D converter by the inverse of the conversion ratio of this converter. Consequently, it is necessary to know the conversion ratio with an accuracy that is superior to the accuracy of the A/D converter and the voltage converter is generally made so that this accuracy requirement is satisfied to the utmost, or a standard signal source is generally set up and the voltage amplitude of signals obtained through the voltage converter is determined by the A/D converter and the error in the conversion ratio is corrected by calculation after the determination.

When a transformer is used as an example of a voltage converter, transformers of large shape are more expensive, depending on the frequency band that is used, and except when at ½ partial pressure, there is a problem with accuracy because of coil resistance and leakage inductance.

The method whereby amplifier 12 (signal normalizer hereafter) having multiple amplification factors in stages is set up in front of the input part of A/D converter 11 is another method that does not have the above-mentioned restrictions, as in the case of the alternating-current voltage determination device 10 in FIG. 1. Signal normalizer 12 has the function of amplification and output so that the voltage amplitude of signals that are input by signal generator 13 stays within a predetermined range. As a result, the maximum input voltage to A/D converter 11 is always close to the full-scale voltage of A/D converter 11, regardless of the size of the voltage amplitude of the input signals, and the effect of linearity errors due to A/D converter 11 is reduced. However, although an amplifier is used in this method, progress has been made in terms of high integration and high performance, even with popular amplifiers on the market, and space-saving effects are marked, regardless of the frequency used.

Depending on the width of the voltage range to be determined, there are cases in which multiple amplification factors of the normalizer are set up in stages in order to finely divide this voltage range. In this case, unless the ratio of the amplification factor before the amplification factor of the signal normalizer is changed and the amplification factor after it has been changed (simply amplification factor ratio hereafter) is known within a desired range of accuracy, the linearity of the determination value will be interrupted by the time when the amplification factor of the signal normalizer is changed as the dividing line, and new linearity errors will be produced. Therefore, the effect of improving errors with a normalizer will not be obtained.

For instance, when the amplification factor of signal normalizer 12 is set using a popular type of network resistance for the part comprising signal normalizer 12, an accuracy of only 100 ppm at the most can be realized. Therefore, by setting up normalizer 12, the effect of linearity errors of A/D converter 11 on the determination values is reduced, but a new linearity error is produced due to the insufficient accuracy of the amplification factor ratio in signal normalizer 12. Consequently, in order to obtain appropriate results when using a signal normalizer for the purpose of reducing the effect of linearity errors of the A/D converter on determinations, it is necessary to precisely determine the amplification factor ratio of the signal normalizer so that linearity of the determinations is maintained.

The method in which only the amplification factor of signal normalizer 12 is changed while keeping constant the amplitude of signals input to input normalizer 12, the output amplitude of signal normalizer 12 is determined by A/D converter 11 before and after this change is determined, and determinations are performed based on this determination ratio is a method for determining the amplification factor ratio of the signal normalizer 12. For instance, when determinations of the signal normalizer are performed with an amplification factor of 1× and 10×, first, the amplification factor of signal normalizer 12 is set at 1× and signals are input from signal generator 13 to signal normalizer 12 so that the maximum input voltage to A/D converter 11 is $\frac{1}{10}_{th}$ the full-scale voltage of A/D converter 11. The voltage of the determination frequency component is calculated from the determination results with A/D converter 11 at this time and serves as V1. Then the amplification factor of signal normalizer 12 is set at 10×. The voltage amplitude of the signals input to signal amplifier 12 is not changed and therefore, the maximum input voltage to A/D converter 11 is the full-scale voltage of A/D converter 11. The voltage of the determination frequency component is calculated from the determination results with A/D converter 11 at this time and serves as V2. As a result, the amplification factor ratio obtained from the determination results is found as V2/V1.

By means of the above-mentioned method, the maximum input voltage to A/D converter 11 during V1 determination is $1/10_{th}$ the full-scale voltage of the A/D converter. Consequently, the determination of V1 contains the linearity error of A/D converter 11 and therefore, the amplification factor ratio lacks accuracy and the result of reducing the determination error by normalizer 12 is not adequately obtained, even if the voltage amplitude of the input signals is determined by concomitantly using signal normalizer 12.

SUMMARY OF THE INVENTION

The present invention includes a method and a device for determining the amplification factor before the amplification factor of a signal normalizer is changed and the amplification factor after it is changed at a predetermined accuracy, its purpose being to obtain the appropriate error-reducing results with this signal normalizer based on the amplification factor ratio as determined using this method or device when the determination device has a signal normalizer for the purpose of reducing linearity errors.

Moreover, the invention prevents the scale of the circuit from becoming very large with an increase in the determination frequency by using a signal normalizer.

The invention also allows for reduced cost by constructing the present invention so that inexpensive parts can be used.

In a first aspect, the invention includes a method for determining the amplification factor ratio before and after changing the amplification factor of a signal normalizer that amplifies the voltage amplitude of signals that are input from a signal generation means so that it is within a predetermined range and outputs that voltage amplitude by using a signal generation means, which adds two sine-wave signals of the same frequency and voltage amplitude to form the output and controls the output voltage amplitude at any phase relationship between said two sine-wave signals by a phase control means, and an alternating-current voltage determination means, comprising an adjustment step wherein when the above-mentioned phase relationship is reversed so that the above-mentioned sine-wave signals are negated, the output voltage amplitude of the above-mentioned signal generator stays within a predetermined range and the step wherein the amplification factor of the above-mentioned signal normalizer and the output voltage amplitude of the above-mentioned signal generator are each changed so that they are inversely proportional and a difference is obtained between the output voltage amplitude of the above-mentioned signal normalizer before the above-mentioned change and that after the above-mentioned change.

Moreover, a second aspect of the invention includes a step wherein the output voltage amplitude of the above-mentioned signal generation means is amplified.

Furthermore, in a third aspect of the invention, the above-mentioned adjustment step includes a step wherein the voltage amplitude of at least one of the above-mentioned two sine-wave signals is controlled and in that it further comprises:

the step wherein the amplification factor in the above-mentioned amplification step is determined and the step wherein the output voltage amplitude of the above-mentioned signal generation means that has been adjusted by the above-mentioned adjustment step is determined.

A fourth aspect of the invention includes the step wherein one of the above-mentioned two sine-wave signals is produced by the synthesis of two or more sine-wave signals with the same frequency and the step wherein the voltage amplitude of the above-mentioned two or more sine-wave signals is controlled in the above-mentioned adjustment step.

Moreover, a fifth aspect of the invention includes a device for determining the amplification factor ratio before and after changing the amplification factor of a signal normalizer that amplifies the voltage amplitude of signals that are input from a signal generation means so that it is within a predetermined range and outputs that voltage amplitude and that consists of a signal generation means, which adds two sine-wave signals of the same frequency and the same voltage amplitude to form the output and controls the output voltage amplitude at any phase relationship between said two sine-wave signals by a phase control means, and an alternating-current voltage determination means, comprising a means by which, when the above-mentioned phase relationship is reversed so that the above-mentioned sine-wave signals are negated, the output voltage amplitude of the above-mentioned signal generator stays within a predetermined range and a means by which the amplification factor of the above-mentioned signal normalizer and the output voltage amplitude of the above-mentioned signal generator are each changed so that they are inversely proportional and a difference is obtained between the output voltage amplitude of the above-mentioned signal normalizer before the above-mentioned change and that after the above-mentioned change.

In a sixth aspect of the invention, the signal generation means includes a means by which the output voltage amplitude of the above-mentioned signal generation means is amplified.

In a seventh aspect of the invention, the above-mentioned adjustment means is a means whereby the voltage amplitude of at least one of the above-mentioned two sine-wave signals is controlled and comprises a means by which the amplification factor of the above-mentioned amplification means is determined and a means by which the output voltage amplification of the above-mentioned signal generation means that has been adjusted by the above-mentioned adjustment means is determined.

In an eighth aspect of the invention, one of the above-mentioned two sine-wave signals is a synthetic signal of 2 or more sine-wave signals with the same frequency and the above-mentioned adjustment means is a means for controlling the voltage amplitude of the above-mentioned two or more sine-wave signals.

BRIEF DESCRIPTION OF THE DRAWINGS

FIG. 1 is a drawing of the alternating-current voltage determination device and the signal generator of the prior art;

DETAILED DESCRIPTION OF THE INVENTION

The following definitions are presented to provide a better understanding of the Figures in conjunction with the following detailed description of the invention.

Definition of symbols

Figure 2:
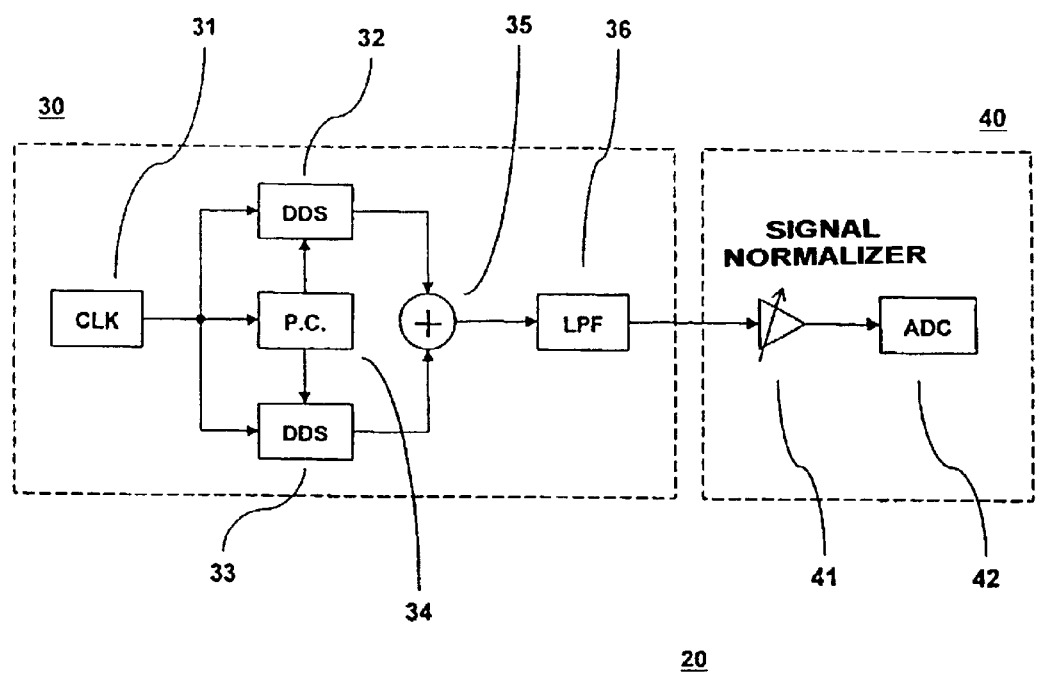
FIG. 2 is a drawing showing a first example of the present invention.

40. Alternating-current voltage determination device
41. Signal normalizer
42. Analog-digital converter
80. Alternating-current determination system
90. Signal generator
91. Reference generator
92, 93. Direct signal synthesizers
94. Phase control device
95. Adder
96. LPF
97. Amplifier
98. D/A converter The method and the device of the present invention are described below based on examples shown in the attached drawings. FIG. 2 shows the first example, which is the basic embodiment of the device of the present invention that uses the method of the present invention. This example is voltage determination system 20 for alternating current signals. It comprises signal generator 30, which is the signal generation means, and alternating-current voltage determination device 40.

Signal generator 30 has reference generator 31, two direct digital synthesizers 32 and 33 (DDS hereafter) that generate sine-wave signals, phase control device 34, which is an example of a phase control means, adder 35, which is an example of an addition means, and low-pass filter (LPF hereafter) 36, which is an example of a filter means, and it is connected to alternating-current voltage determination device 40.

Reference generator 31 generates reference signals of frequency N·f (Hertz) where the output frequency f (Hertz) of signal generator 30 has been multiplied by a predetermined multiplying factor N and supplies these signals to the two DDS devices and phase control device 34.

The two DDS devices generate false sine waves of voltage amplitude A/2 and frequency f (Hertz) and after the outputs are added by adder 35, the higher harmonic waves contained in the false sine waves are filtered by LPF 36 to obtain the output of signal generator 30.

Phase control device 34 has phase resolution N and is connected to the two DDS devices, so that the phase of the signals generated by each DDS is independently controlled.

Alternating-current voltage detector 40 has signal normalizer 41 and A/D converter 42, which is an alternating-current voltage detection means.

Signal normalizer 41 has amplification factors of 1× and 10× and is placed in front of the input part of A/D converter 42.

The present invention is constructed as described above in the first example. The theory of obtaining the ratio of the amplification factor before changing the amplification ratio of above-mentioned signal normalizer 41 and the amplification factor after the change (simply amplification factor ratio hereafter) is described below:

First, the amplification factor of signal normalizer 41 is set at 1×. The voltage amplitude of signals supplied from signal generator 30 through signal normalizer 41 to A/D converter 42 is determined by A/D converter 42 and the value that is obtained serves as V1. V1 here is the voltage adjusted by signal generator 30 so that the determination is performed near the full-scale voltage of A/D converter 42.

Next, the amplification factor of signal normalizer 41 is set at 10×. The voltage amplitude of the signals that are output from signal generator 30 is converted to the inverse of the amplification factor of signal generator 41, that is, $1/10^{th}$. Furthermore, the voltage amplitude of signals supplied from signal generator 30 through signal normalizer 41 to A/D converter 42 is determined by A/D converter 42 and the value that is obtained serves as V2. Unless there is a large difference in the true value of the amplification factor ratio of signal normalizer 41 in comparison to 10, which is the apparent amplification factor ratio, as with V1, determinations of V2 are performed near the full-scale voltage of A/D converter 42.

In this case, the true value of this amplification factor ratio is obtained by multiplying V2/V1 by 10, which is the apparent amplification factor, in order to correct errors. The values V1 and V2 that are used here are determined near the full-scale voltage of A/D converter 42 and therefore, they are not affected by linearity errors of A/D converter 42 and the amplification factor ratio of signal normalizer 41 can be obtained. When the alternating-current voltage is determined, the amplification factor of signal normalizer 41 is controlled so that the voltage amplitude of the signals that are input to A/D converter 42 will be near the full-scale of A/D converter 42 and the signals that are input to A/D converter 42 are determined. The voltage of the alternating-current signals determined by calculation is obtained based on the true value of the voltage amplitude of these signals and the amplification factor ratio of signal normalizer 41. Furthermore, determination errors by A/D converter 42 can be disregarded and therefore, determination errors in the amplification factor ratio depend on the accuracy of the output voltage amplitude of signal generator 30.

By means of the present invention, it is necessary to use alternating-current signals, the voltage amplitude of which varies in accordance with the number of amplification factors of the signal normalizer. The method in which multiple signal generators have voltage amplitudes of a fixed level is considered to be a simple method, but there are mathematical problems with the signal generator, and it is not easy to maintain the voltage amplitude of multiple signal generators at their respective predetermined ratio. Therefore, in this example, two signal sources are set up instead and the synthesis vector of these signal sources forms the output of the signal generator. The phase relationship of these signal sources is controlled and the voltage amplitude of the output signals is varied precisely.

The theory of the method of the present invention is described in further detail below using mathematical formulas.

As previously explained, signal generator 30 adds the output of the two DDS devices and the output signals of signal generator 30, which represent the synthesis vector, control the phase difference between the two DDS devices and thereby vary the voltage amplitude of these signals.

The phase difference θ of the two DDS devices in this example is held to the integral increase of $2\pi/N$ (rad) by phase control device 34. The output signal voltage $V_c$ devices of signal generator 30 is the synthesis vector of the signals that are output from the two DDS devices, and any value is obtained as this amplitude, depending on the phase difference θ, as shown in the following two formulas:

$$v_{cal} = \frac{1}{2}Ae^{j2\pi ft} + \frac{1}{2}Ae^{j(2\pi ft+\theta)} \qquad \text{formula 1}$$
$$= \frac{1}{2}A(1+e^{j\theta})e^{j2\pi ft}$$

$$v_{adc1} = \frac{1}{2}A(1+e^{j\theta_1}) \qquad \text{formula 3}$$

When the amplification factor of signal normalizer 41 is 1× and the phase difference θ (rad) is θ1 (=0), the signals are input so that the maximum input voltage to A/D converter 42 is almost the full-scale voltage.

The amplification factor of signal normalizer 41 is set at 1× and the phase difference θ is set at θ1. The voltage of the determination frequency component is calculated from the determination results of the A/D converter and this serves as $V_{adc1}$.

$$|\hat{v}_{cal}| = \left|\frac{1}{2}A(1+e^{j\theta})\right| \qquad \text{formula 2}$$
$$= \frac{1}{2}A\sqrt{2(1+\cos\theta)} = \frac{1}{2}A \cdot 2\cos\frac{\theta}{2}$$
$$= A\cos\frac{\theta}{2}$$

Next, the amplification factor of signal normalizer 41 is set at 10× and the phase difference θ is set at θ2 (=2π·30/64). θ2 is selected so that the amplitude of the output of the detection device is $\frac{1}{10}^{th}$ that when the phase difference is set at θ1. When the output amplitude is 1 when the phase difference is set at θ1, the voltage amplitude of the signals that are output from signal generator 30 with the above-mentioned setting is 0.098017 from formula 2. The voltage of the determination frequency component is calculated from the determination results of the A/D converter and this serves as $V_{adc2}$.

$$v_{adc2} = g_{nom}\frac{1}{2}A(1+e^{j\theta_2}) \qquad \text{formula 4}$$

The true value $g_{nom}$ of the multiplication factor ratio when the multiplication factor of signal normalizer 41 is set at 10× is represented by the following formula:

$$g_{nom} = \frac{v_{adc2}(1+e^{j0})}{v_{adc1}(1+e^{j2\pi \cdot 30/64})} \qquad \text{formula 5}$$
$$\cong (1-j10.15317)\frac{v_{adc2}}{v_{adc1}}$$

Even though the amplification factor of signal normalizer 41 is set at either 1× or 10×, the maximum input voltage to A/D converter 42 is almost the full-scale voltage and therefore, the amplification factor ratio of signal normalizer 41 can be determined without any effect from the linearity error of A/D converter 42. Determination accuracy is determined by the relative accuracy of the voltage amplitude of the signals that are output from signal generator 30 when the phase difference θ is set at θ1 and θ2. The output of signal generator 30 is controlled by the phase difference of the two DDS devices and therefore, the accuracy of the phase difference represents this relative accuracy. When the error in the phase is Δθ, the error in the voltage amplitude of the signals that are output from signal generator 30 is represented by the following 2 formulas:

$$\frac{\Delta v_{cal}}{v_{cal}} = \frac{e^{j\theta}}{1+e^{j\theta}}(e^{j\Delta\theta}-1) \qquad \text{formula 6}$$

$$\left|\frac{\Delta v_{cal}}{v_{cal}}\right| \cong \frac{\Delta\theta}{2\cos\left(\frac{\theta}{2}\right)} \quad (\because \Delta\theta \ll 1) \qquad \text{formula 7}$$

The recent increased speed of digital hardware technology has made it easy to hold timewise errors, such as DDS jitters, etc., to 100 picoseconds or less. Therefore, sufficiently high phase accuracy is obtained in low frequency regions. When the DDS output signal frequency is set at 1 kHz and jitters at 100 picoseconds, the phase accuracy is 0.6 micro(rad). Consequently, when the amplification factor of signal normalizer 41 is set at 1×, the error in the voltage amplitude of the signals that are output from the signal generator is 0.3 ppm, and similarly, the error when the amplification factor is set at 10× becomes 3 ppm and it is possible to control the output voltage amplification of signal generator 30 with high accuracy.

Although the amplification factor of signal normalizer 41 was set at 1× and 10× in the present example, the amplification factor is not limited to these examples and determinations of signal normalizer 41 with a combination of various amplification factors, such as 1× and 5×, 2× and 8×, etc., can be performed by setting the phase differences θ1 and θ2 between the DDS devices at the appropriate values.

The method and the device of the present invention were described with the above-mentioned examples. However, errors are actually produced in the amplitude direction and the phase direction of each DDS device because of fluctuations in parts, etc., and this error is manifested as an error in the voltage amplitude that is input from signal generator 41. This voltage amplitude is not as ideal as in formula 2. Therefore, it is necessary to reduce errors to the required accuracy or less by adding an adjustment means for correcting this error to the DDS.

Figure 3:
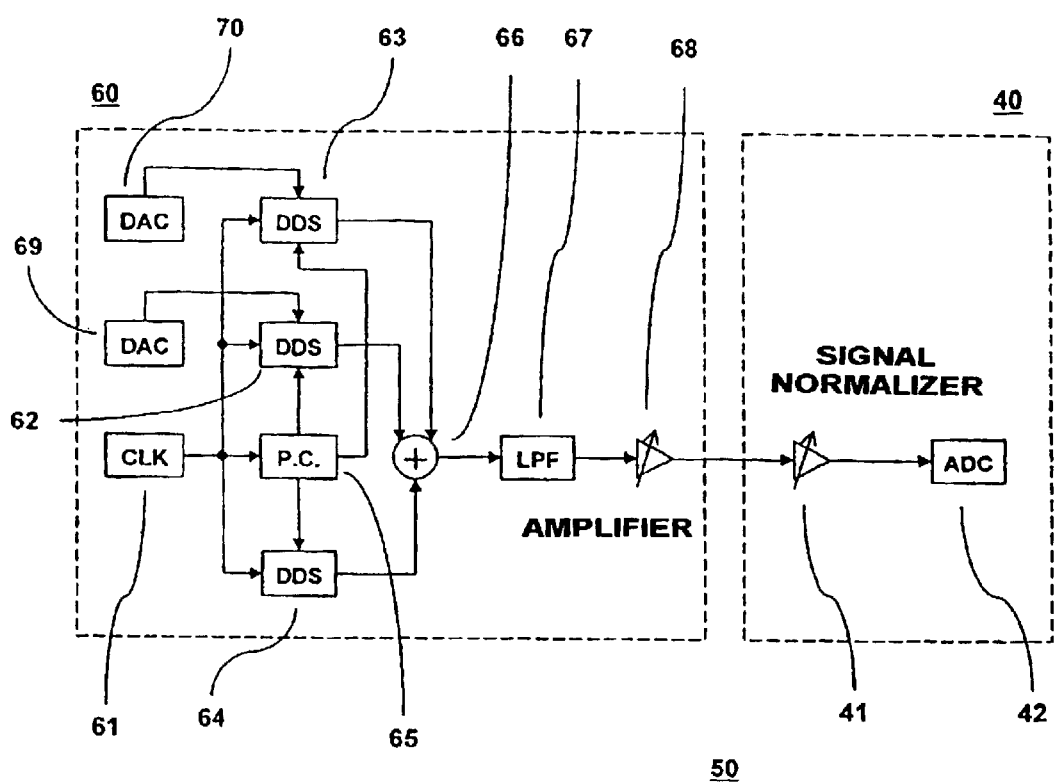
FIG. 3 is a drawing showing a second example of the present invention.

Voltage determination system 50 for alternating-current signals with an adjustment means is shown in FIG. 3 as a second example of the present invention in order to solve the above-mentioned problems Voltage determination system 50 comprises signal generator 60, which is a signal generation means, and above-mentioned alternating-current voltage determination device 40.

Signal generator 60 has reference generator 61, three DDS devices 62, 63, and 64 that generate sine-wave signals, phase control device 65, which is an example of a phase control means, adder 66, which is an example of an addition means, LPF 67, which is an example of a filter means, amplifier 68, which is an amplification means, and two digital-analog converters (D/A converter hereafter) 69 and 70, which are adjustment means, and is connected to alternating-current voltage determination device 40.

Reference generator 61 generates reference signals of frequency N·f (Hertz), in which the output frequency f (Hertz) of signal generator 60 is multiplied by a predetermined multiplication factor N and supplied to the three DDS devices as well as phase control device 65.

The three DDS devices generate false sine waves of voltage amplitude A/2 and frequency f (Hertz), and after these outputs are added by adder 66, the higher harmonic waves contained in the false sine waves are filtered by LPF 67 and are voltage-amplified by amplifier 68 and then become the output of signal generator 60. Moreover, D/A converter 69 is connected to DDS 62 and D/A converter 70 is connected to DDS 63 and voltage amplitude of the output signals of the corresponding DDS is controlled by the respective D/A converter.

Phase control device 65 has phase resolution N and is connected to the three DDS devices so that the phase of the signals generated by each DDS is independently controlled.

The theory of the method of the present invention will now be described.

In the present example, the discrepancies in voltage amplitude and phase produced in the output signals of the two DDS devices that construct the output signals of signal generator 60, that is, DDS 62 and 64, are corrected and the error in the voltage amplitude produced in the output signals of signal generator 60 are corrected for determinations of the amplification factor ratio of signal normalizer 41. In the present example, DDS 63 is also set up as a third DDS device in comparison to the 2 DDS devices of the first example in order to correct the discrepancy in the phase direction.

Furthermore, the method of determining the amplification factor ratio of signal normalizer 41 is in no way different from that of the first example.

The theory of the method of the present invention is described in further detail below using mathematical formulas:

First, in order to correct the discrepancy in the amplitude direction between DDS 62 and DDS 64, the phase difference $\theta$ is set at $\pi$ in order to satisfy formula 2, with the phase difference between DDS 62 and DDS 64 being $\theta$ (rad). With respect to the error that is produced by the above-mentioned DDS devices, D/A converter 69 changes the voltage amplitude of the output signals of DDS 62 so that the error in the amplitude direction is corrected.

Moreover, in order to correct the discrepancy in the phase direction between DDS 62 and DDS 64, DDS 63 is controlled by the phase control device so that it always has a phase difference of $\pi/2$ with respect to DDS 62. In this case, D/A converter 70 changes the voltage amplitude of the output signals of DDS 63 so that the error in the phase direction is corrected.

Furthermore, the voltage amplitude of the signals that are output from signal generator 60 are determined by A/D converter 42 while adjusting the two D/A converters so that this voltage amplitude is at its minimum. Furthermore, this voltage amplitude cannot be detected by A/D converter 42 when it is less than the minimum resolution of A/D converter 42, and therefore, the amplification factor of amplifier 68 is raised and errors produced by the DDS devices are corrected by further similar adjustment.

Once this adjustment has been performed, an error will be made in the voltage amplitude of the signals that are output from signal generator 60 in accordance with the size of this residual error $\epsilon$ unless the output amplitude of signal generator 60 is zero. Consequently, D/A converters 69 and 70 must have sufficient resolution. When the voltage amplitude accuracy of the signals that are input to A/D converter 42 is $\Delta cal$ and the amplification factor of signal normalizer 41 is $G_{nom}$, the number of bits $M_{dac}$ necessary for the resolution of the two D/A converters is represented by the following formula:

$$M_{dac} \geq \log_2\left(\frac{G_{nom}}{\Delta cal}\right) \quad \text{formula 8}$$

For instance, when signal normalizer 41 with amplification factors of 1× and 10× is determined at an accuracy of 10 ppm, $\Delta cal$=10 ppm and $G_{nom}$=10 and therefore, according to formula 9, a D/A converter having a resolution of 20 bits or more is necessary.

When zero is detected during the adjustment of signal generator 60, A/D converter 42 must detect changes in the voltage amplitude adjusted by the minimum resolution of the two D/A converters, and therefore, if the number of bits of A/D converter 42 is $M_{adc}$, the amplification factor necessary for amplifier 68 $G_{cal}$ is represented by the following formula:

$$G_{cal} \geq \frac{1}{2^{(M_{adc}-1)}} \frac{1}{\Delta cal} G_{nom} \quad \text{formula 9}$$

For instance, when A/D converter 42 having a resolution of 18 bits is used, $M_{adc}$=18, and therefore, according to formula 10, the amplification factor necessary for amplifier 68 is approximately 7.6 times or higher.

In the present example, the discrepancy of the amplitude direction and the phase direction produced by the DDS devices is eliminated by the D/A converter and the voltage amplitude of the signals that are output from signal generator 60 is brought to the ideal state shown in the first example. Nevertheless, using a high-resolution D/A converter during production of the device is not favorable in terms of cost. Therefore, a third example is presented with which the same determination accuracy is obtained, even if a low-resolution D/A converter is used.

Figure 4:
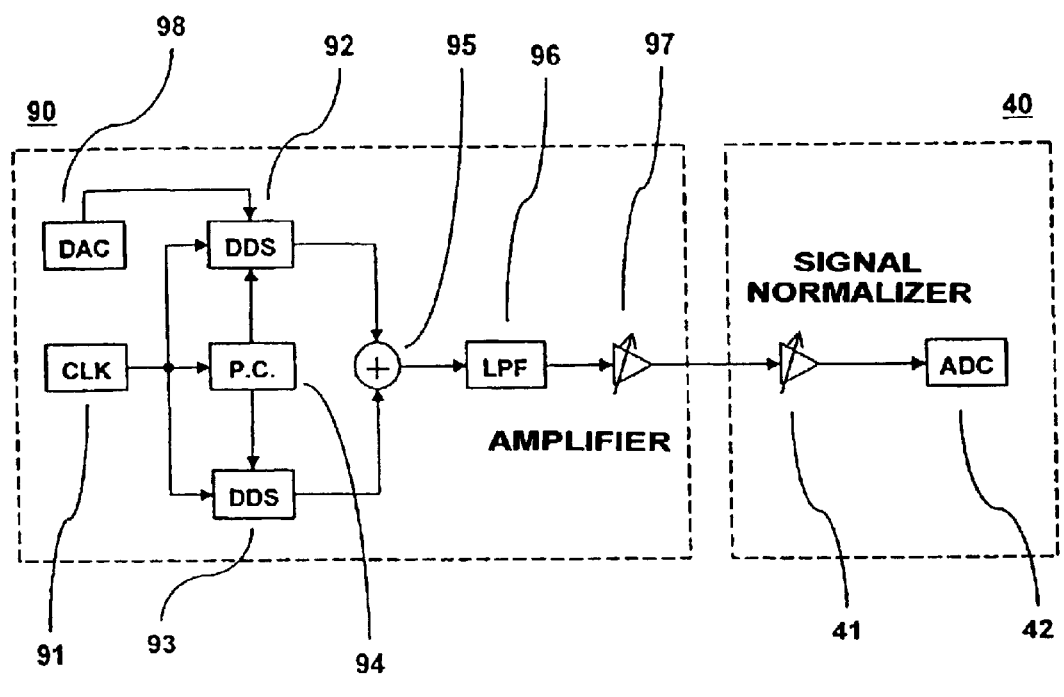
FIG. 4 is a drawing showing a third example of the present invention.

The third example in FIG. 4 is voltage determination system 80 of alternating-current signals and it comprises signal generator 90, which is the signal generation means, and the above-mentioned alternating-current voltage determination device 40.

Signal generator 90 has reference generator 91, two DDS devices 92 and 93 that generate sine waves, phase control device 94, which is an example of a phase control means, adder 95, which is an example of an addition means, LPF 96, which is an example of a filter means, amplifier 97, which is an amplification means, and D/A converter 98, which is an adjustment means, and is connected to alternating-current voltage determination device 40.

Reference generator 91 generates reference signals of frequency N·f (Hertz) in which the output frequency f (Hertz) of signal generator 90 is multiplied by the predetermined multiplication factor N and supplies these signals to the two DDS devices and phase control device 94.

The two DDS devices generate false sine waves of voltage amplitude A/2 and frequency f (Hertz) and these outputs are added by adder 95. Then the higher harmonic waves contained in the false sine waves are filtered by LPF 96 and the voltage is amplified by amplifier 97. This becomes the output of signal generator 90. Moreover, D/A converter 98 is connected to DDS 92 and the voltage amplitude of the output signals of DDS 92 is controlled by D/A converter 98.

Phase control device 94 has phase resolution N and is connected to the two DDS devices so that the phase of the signals generated by the respective DDS is independently controlled.

The theory of the method of the present invention is described below:

In the second example, a high-resolution D/A converter is set up as an adjustment means for error correction of the amplitude direction and the phase direction, but in the present example, a D/A converter is set up for the amplitude direction only and the phase direction is not adjusted. In addition, the resolution of the D/A converter for the amplitude direction is relatively low. When the frequency of the output signals of signal generator 90 is low, the error in the phase direction is very small when compared to the amplitude direction, but an error still remains in the phase direction. Furthermore, the adjustment accuracy of the amplitude direction is also insufficient and the signals that are output from signal generator 90 are not in the ideal state shown in the first example and a very small error vector (residual error hereafter) remains. Therefore, in the present example the residual error is determined and corrected by calculation and an amplification factor ratio of the same accuracy as in the second example can be obtained. Furthermore, the method of determining the alternating-current signal voltage is the same as in the above-mentioned example.

The theory of the method of the present invention is described below in further detail using mathematical formulas:

When the signals output from DDS 92 deviate from the ideal state by residual error $\epsilon$, the voltage amplitude $V_{cal}$ of the signals that are output from signal generator 90 is represented by the following formula with the phase difference between DDS 92 and DDS 93 as $\theta$ (rad). The residual error $\epsilon$ contains both amplitude and phase components and is a complex number in the following formula:

$$v_{cal} = \left(\frac{1}{2}A + \varepsilon\right)e^{j2\pi ft} + \frac{1}{2}Ae^{j(2\pi ft+\theta)} \qquad \text{Formula 10}$$
$$= \left\{\frac{1}{2}A(1+e^{j\theta}) + \varepsilon\right\}e^{j2\pi ft}$$

When phase difference $\theta$ is set at $\pi$, there is residual error $\epsilon$ in the voltage amplitude of signals output from signal generator 90 and therefore, direct determinations can be performed. However, since residual error $\epsilon$ is a very small signal, amplifier 97 set up in signal generator 90 is set at a high amplification factor $G_{cal}$ and the voltage amplitude of the signals that are input to A/D converter 42 is amplified considerably and determined, in order to reduce the effect of linearity error of A/D converter 42 when determining residual error $\epsilon$. The true value $g_{cal}$ of the amplification factor of this amplifier 97 must be pre-determined.

In order to find this true value $g_{cal}$ here, the amplification factor of amplifier 97 is set at 1×, the amplification factor of signal normalizer 41 is set at 1×, and the phase difference $\theta$ of signal generator 90 is set at $\pi$. D/A converter 98 is set up and the voltage amplitude of the signals that are output from signal generator 90 is adjusted so that the maximum input voltage is input to A/D converter 42. The voltage value of the determination frequency component is calculated from the determination results of A/D converter 42. The true value of this voltage at this time serves as $V_{adc\alpha}$.

Moreover, the amplification factor of amplifier 97 is set at $G_{cal}$. The voltage value of the determination frequency component is calculated from the determination results of A/D converter 42. The true value of this voltage at this time serves as $V_{adc\beta} \cdot g_{cal}$ is found as in the following formula by determining these two values:

$$g_{cal} = \frac{v_{adc\beta}}{v_{adc\alpha}} \qquad \text{formula 11}$$

Next, the residual error of the voltage amplitude of output signals of signal generator 90 is determined. For instance, the voltage value of the determination frequency component is determined by A/D converter 42 while D/A converter 98 is adjusted so that the voltage amplitude of the signals that are output from signal generator 90 is brought to a minimum. After this adjustment, the voltage value of the determination frequency component is calculated from the determination results of A/D converter 42. The true value of this voltage at this time serves as $V_{adc\epsilon}$.

$$v_{adc\epsilon} = \left\{\varepsilon + \frac{1}{2}A(1+e^{j\pi})\right\}g_{cal} \qquad \text{formula 12}$$
$$= \varepsilon \cdot g_{cal}$$

Next, the amplification factor ratio of the signal normalizer is found. First, the amplification factor of amplifier 97 is set at 1×, the amplification factor of signal normalizer 41 is set at 1×, and the phase difference $\theta$ is set at $\theta1$ (=0). The voltage value of the determination frequency component is calculated from the determination results of the A/D converter and this serves as $V_{adc1}$.

$$v_{adc1} = \varepsilon + \frac{1}{2}A(1+e^{j\theta_1}) \qquad \text{formula 13}$$

Moreover, the amplification factor of signal normalizer 41 is set at 10× and phase difference $\theta$ is set at $\theta2$ (=$2\pi \cdot 30/64$). $\theta2$ is selected so that the amplitude of the output of the determination device is $\frac{1}{10}^{th}$ that when the phase difference is set at $\theta1$. When the output amplitude is 1, when the phase difference is set at $\theta1$, the output amplitude of the determination device with the above-mentioned setting is 0.098017 from formula 2. The voltage value of the determination frequency component is calculated from the determination results of the A/D converter. This serves as $V_{adc2}$.

$$v_{adc2} = g_{nom}\left\{\varepsilon + \frac{1}{2}A(1+e^{j\theta_2})\right\} \qquad \text{formula 14}$$

Here, $g_{nom}$ is the true value of the amplification factor ratio when the amplification factor of signal normalizer 41 is changed from 1× to 10×.

This amplification factor ratio $g_{nom}$ from formulas 12, 13 and 14 is represented by the following formula:

$$g_{nom} = \frac{v_{adc2}(1+e^{j\theta_1})}{v_{adc1}(1+e^{j\theta_2}) + \frac{v_{adc\epsilon}}{g_{cal}}(e^{j\theta_1} - e^{j\theta_2})} \qquad \text{formula 15}$$

The determination error of residual error $\epsilon$ becomes the error in the amplification factor ratio determination of the signal normalizer in this example. The resolution of D/A converter 98 and the amplification factor of amplifier 97 that are needed to make the determination error of residual error $\epsilon$ sufficiently small can be estimated as follows:

The main factor in the determination errors is the linearity error of A/D converter 42. When this linearity error is generated at a constant rate $\delta$ to the full-scale voltage $V_{adc\_fs}$ of A/D converter 42, this determination or measured value $V_{adc\_m}$ with respect to the true $V_{adc}$ of the voltage amplitude of the signals that are input to A/D converter 42 is represented by the following formula 16.

$$v_{adc\_m} = v_{adc} + v_{adc\_fs}\delta \qquad \text{formula 16}$$
$$= v_{adc}\left(1 + \frac{v_{adc\_fs}}{v_{adc}}\delta\right)$$

Here, the following relationship is established between the full-scale voltage of A/D converter 42 and each determination value. During determinations of $V_{adc\ \alpha}$, at most, approximately $1/G_{cal}$ of the full-scale voltage of A/D converter 42 is input to A/D converter 42. Moreover, at most, the full-scale voltage of A/D converter 42 is input to A/D converter 42 during $V_{adc\ \beta}$ determinations. Furthermore, when the amplification factor of signal normalizer 41 is set at 1×, the phase difference θ is set at zero, and the amplification factor of amplifier 97 is set at 1×, the voltage that is approximately equal to the full-scale voltage of A/D converter 42 is input to A/D converter 42.

Consequently, the determination values $V_{adc\alpha\_m}$, $V_{adc\beta\_m}$, and $V_{adc\epsilon\_m}$ of true values $V_{adc\ \alpha}$, $V_{adc\beta}$, and $V_{adc\epsilon}$, respectively, are represented by the following 3 formulas:

$$v_{adc\alpha\_m} = v_{adc\alpha}\left(1 + \frac{v_{adc\_fs}}{v_{adc\alpha}}\delta\right) \qquad \text{formula 17}$$
$$\cong v_{adc\alpha}(1 + G_{cal}\delta)$$

$$v_{adc\beta\_m} = v_{adc\beta}\left(1 + \frac{v_{adc\_fs}}{v_{adc\beta}}\delta\right) \qquad \text{formula 18}$$
$$\cong v_{adc\beta}(1 + \delta)$$

$$v_{adc\epsilon\_m} = v_{adc\epsilon}\left(1 + \frac{v_{adc\_fs}}{v_{adc\epsilon}}\delta\right) \qquad \text{formula 19}$$
$$\cong v_{adc\epsilon}\left(1 + \frac{A}{\epsilon G_{cal}}\delta\right)$$

The determination value $G_{cal\_m}$ of $g_{cal}$ from formulas 17 and 18 is represented by the following formula:

$$g_{cal\_in} = \frac{v_{adc\beta\_m}}{v_{adc\alpha\_m}} \qquad \text{formula 20}$$
$$= \frac{v_{adc\beta}}{v_{adc\alpha}} \cdot \frac{1+\delta}{1+G_{cal}}\delta$$
$$\cong g_{cal}(1 + \delta - G_{cal}\delta) \quad (\because \delta \ll 1, G_{cal}\delta \ll 1)$$
$$\cong g_{cal}(1 - G_{cal}\delta) \quad (\because G_{cal} \gg 1)$$

εm to which the error of residual error ε has been added from formulas 12, 19 and 20 is represented by the following formula:

$$\epsilon_m = \frac{v_{adc\epsilon\_m}}{g_{cal\_m}} \qquad \text{formula 21}$$
$$= \epsilon \frac{1 + \frac{A}{\epsilon G_{cal}}\delta}{1 - G_{cal}\delta} \quad \left(\because \frac{A}{\epsilon G_{cal}}\delta \ll 1, G_{cal}\delta \ll 1\right)$$
$$\cong \epsilon\left(1 + \frac{A}{\epsilon G_{cal}}\delta + G_{cal}\delta\right)$$
$$= \epsilon + \frac{A}{G_{cal}}\delta + \epsilon G_{cal}\delta$$
$$= \epsilon + \Delta\epsilon$$

The effect of the determination error Δε of residual error ε increases with a reduction in the voltage amplitude of signals output from signal generator 90. Therefore, only the error of signal generator 90 when the phase difference θ is θ2 should be considered. When the voltage amplitude of the signals that are output from signal generator 90, that is, output from amplifier 97, is $V_{cal}$, the magnitude Δcal of the determination error of residual error ε to the magnitude $|V_{cal}|$ of this voltage amplitude from formulas 2 and 21 is represented by the following formula:

$$\Delta cal = \frac{\Delta\epsilon}{|v_{cal}|} \qquad \text{formula 22}$$
$$= \frac{\frac{A}{G_{cal}}\delta + \epsilon G_{cal}\delta}{A\cos(\theta_2/2)}$$
$$= \left(\frac{1}{G_{cal}} + \frac{\epsilon}{A}G_{cal}\right)\delta \frac{1}{\cos(\theta_2/2)}$$
$$\cong \left(\frac{1}{G_{cal}} + \frac{\epsilon}{A}G_{cal}\right)\delta G_{nom}$$

Based on the above-mentioned formula, the linearity error of A/D converter 42 is clearly determined from amplification factor Gcal of amplifier 97 and the magnitude (ε/A) of residual error ε. When the determination error of residual error ε is small, the magnitude of residual error ε should be reduced by raising the amplification factor of amplifier 98 and increasing the resolution of D/A converter 98. In order to minimize the determination error of residual error ε, the values within parentheses in the above-mentioned formula are minimized or the following formula is satisfied:

$$\left|\frac{1}{G_{cal}}\right| = \left|\frac{\epsilon}{A}G_{cal}\right| \qquad \text{formula 23}$$

Furthermore, in the following formula there is a correlation between the number of bits $M_{dac}$ of D/A converter 98 and the magnitude of the residual error ε (ε/A):

$$\frac{\epsilon}{A} = \frac{1}{2^{M_{dac}}} \qquad \text{formula 24}$$

The following formula is obtained from formulas 23 and 24:

$$G_{cal}^2 = 2^{M_{dac}} \qquad \text{formula 25}$$

Formula 22 can be represented by the following formula when formula 25 is established.

$$\Delta cal \cong \frac{2}{G_{cal}}\delta G_{nom} \qquad \text{formula 26}$$
$$= 2\sqrt{\frac{\epsilon}{A}}\delta G_{nom}$$
$$= 2^{(1-M_{dac}/2)}\delta G_{nom}$$

For instance, when an 18-bit A/D converter 42 is used, the ratio δ of the linearity error is $$\delta = \frac{\sqrt{2}}{2^{M_{adc}-1}} \cong 11[\text{ppm}]$$

if the linearity error is due to a quantization error of A/D converter 42. When signal normalizer 41 having an amplification factor of 1× and 10× is to be determined at an accuracy of 10 ppm, $G_{nom}$=10 and $\Delta_{cal}$=10 ppm and therefore, $$G_{cal} = \frac{2\delta G_{nom}}{\Delta cal} \quad \text{formula 27}$$

$$= \frac{2 \cdot 11[\text{ppm}] \cdot 10}{10[\text{ppm}]}$$

$$= 22$$

$$M_{dac} = 2\log_2(g_{cal}) \quad \text{formula 28}$$

$$= 2\log_2(22)$$

$$\cong 9$$

from formulas 25 and 26.

In the end, the amplification factor of amplifier 97 should be 22 times and the resolution of D/A converter 98 should be 9 bits or more. On the other hand, a D/A converter having a resolution of 20 bits or higher is needed in the second example under the same conditions.

Although in the second example, the determinations are performed while controlling as much as possible the error of the signal normalizer, in the present example, there is an advantage in that when compared to the second example, the resolution needed for the D/A converter used in adjustments is a relatively low-bit resolution in order to determine the error in the signal normalizer and to perform determinations while making corrections using this value, and therefore, a system can be constructed less expensively.

Figure 5:
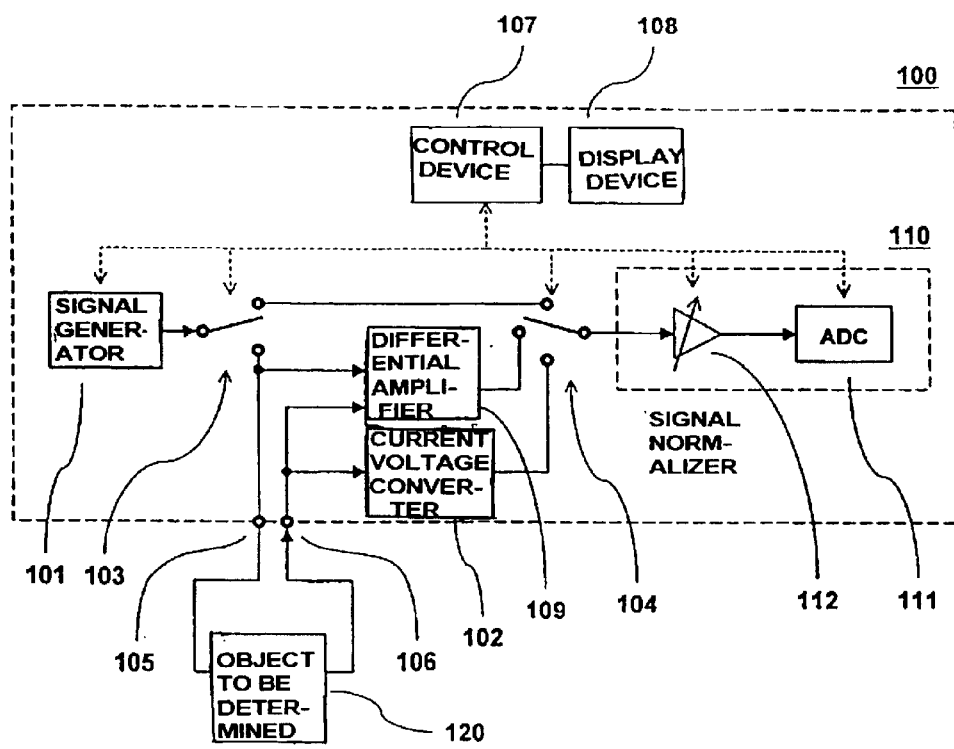
FIG. 5 is a drawing showing a fourth example of the present invention.

By means of the third example, the alternating-current voltage determination device can be constructed with high accuracy and inexpensively. The fourth example is shown in FIG. 5 as an example of using these advantages. This example is LCR meter 100, and it comprises signal generator 101, alternating-current voltage determination device 110, differential amplifier 109, current-voltage converter 102, switches 103 and 104, terminals 105 and 106 connecting the object to be determined 120, control device 107, and display device 108.

Signal generator 101 is connected to switch 103 and the signals generated by signal generator 101 are supplied to switch 104 or terminal 105.

Alternating-current voltage determination device 110 has A/D converter 111 and signal normalizer 112 set up in front of A/D converter 111. Alternating-current voltage determination device 110 is connected to switch 104 and receives signals supplied from either switch 103, differential amplifier 109 that obtains the potential difference between terminal 105 and terminal 106, or current-voltage converter 102 connected to terminal 106.

Control device 107 is connected to and controls signal generator 101, A/D converter 111, signal normalizer 112, and switches 103 and 104, as shown by the broken line. Moreover, control device 107 has an electronic calculation function and calculates the values of data obtained from A/D converter 111 and outputs these values to display device 108 connected to control device 107 and displays the determination results to the user of the LCR meter.

LCR meter 100 has the following effects because of the above-mentioned structure:

First, in order to determine the amplification factor ratio of signal normalizer 112, switches 103 and 104 are made so that the signals from signal generator 101 are directly supplied to alternating-current voltage determination device 110 to obtain the same state as the structure shown in the third example. The amplification factor ratio is determined by the same procedure as shown for the third example. Again, when briefly explained, corrections are made so that the error of signal generator 101 is brought to a minimum and the error that still remains is determined by A/D converter 111. This serves as Vϵ. With respect to each amplification factor of signal generator 112, the voltage amplitude of the output signals of signal generator 101 is adjusted so that the voltage amplitude of the signals supplied from signal generator 101 through signal normalizer 112 to A/D converter 111 becomes the full scale of A/D converter 111 and the voltage amplitude of the signals supplied to A/D converter 111 is determined by A/D converter 111. The determination value at this time serves as $V_n$. However, n is an integer of 1 or higher and the maximum is the number of amplification factors of signal normalizer 112. Control device 107 obtains the true value of the amplification factor ratio of signal normalizer 112 by calculation from the determined Vϵ and Vn.

Furthermore, A/D converter 111 performs successive determinations at a predetermined time interval, and therefore, phase information is actually simultaneously obtained. Consequently, the true value of the amplification factor ratio of signal normalizer 112 can be obtained as a complex number containing a phase component and not a real number that is simply an amplitude component.

Next, in order to determine the impedance of an object to be determined, switch 103 is made so that the output signals of signal generator 101 are supplied to object 120 to be determined. Furthermore, the voltage of signals from differential amplifier 109 and the current converted to voltage displacement by current-voltage converter 102 are determined by alternating-current voltage determination device 110. Voltage and current are continuously determined and the phase difference between voltage and current is also simultaneously obtained by calculation based on the voltage and current obtained by determination. Control device 107 obtains the impedance of the object to be determined by calculation from the current and phase difference and the amplification factor ratio of signal normalizer 112 that has already been obtained.

The impedance of the object to be determined can be determined at a predetermined accuracy by a device that uses the above-mentioned method of the present invention.

Furthermore, the method and the device of the present invention can be applied to any determination system that determines the magnitude of the input level, such as the increase or decrease in the error, in accordance with the input level of an A/D converter, etc. A network analyzer and the like represents an ideal example.

As previously explained in detail, the present invention is constructed and has the effects as described above. Therefore, the ratio of the amplification factor before the amplification factor of the signal normalizer was changed and the amplification factor after the change is determined at a predetermined accuracy. Therefore, when the determination device has a signal normalizer for the purpose of reducing the linearity error, the error-reducing effect of this signal normalizer can be appropriately obtained with this determined amplification factor.

Moreover, a signal normalizer is used and therefore, it is possible to keep the circuit scale from becoming larger in accordance with the determination frequency.

Furthermore, the present invention is constructed so that inexpensive parts can be used and therefore, cost is reduced.

I claim:

1. A method of determining a ratio of an amplification factor before and after changing the amplification factor of a signal normalizer that amplifies the voltage amplitude of signals input from a signal generator so that it stays within a predetermined range and outputs that voltage amplitude by using a signal generator, which adds two sine-wave signals of a same frequency and voltage amplitude to form the output and controls the output voltage amplitude at any phase relationship between said two sine-wave signals by a phase control means, and an alternating-current voltage determination device, comprising an adjustment step wherein when said phase relationship so that said sine-wave signals are negated, the output voltage amplitude of said signal generator stays within a predetermined range and a step wherein the amplification factor of said signal normalizer and the output voltage amplitude of said signal generator are each changed so that they are inversely proportional and a difference is obtained between the output voltage amplitude of said signal normalizer before said change and that after said change.

2. The method of claim 1, further comprising a step wherein the output voltage amplitude of said signal generator is amplified.

3. The method of claim 1, wherein said adjustment step further comprises a step wherein the voltage amplitude of at least one of said two sine-wave signals is controlled and wherein said method further comprises:

the step wherein the amplification factor in said amplification step is determined; and the step wherein the output voltage amplitude of said signal generator that has been adjusted by said adjustment step is determined.

4. The method of claim 1, further comprising:

the step wherein one of said two sine-wave signals is produced by a synthesis of 2 or more sine-wave signals with a same frequency; and a step wherein the voltage amplitude of said two or more sine-wavesignals is controlled in said adjustment step.

5. A device for determining a ratio of an amplification factor before and after changing the amplification factor of a signal normalizer that amplifies a voltage amplitude of signals that are input from a signal generator so that it stays within a predetermined range and outputs that voltage amplitude and that consists of a signal generator, which adds two sine-wave signals of the same frequency and the voltage amplitude to form the output and controls the output voltage amplitude at any phase relationship between said two sine-wave signals by a phase controller, and an alternating-current voltage determination device, comprising an adjustment device for maintaining the output voltage amplitude of said signal generator within a predetermined range when said phase relationship is reversed so that said sine-wave signals are negated, and an amplifier by which the amplification factor of said signal normalizer and the output voltage amplitude of said signal generator are each changed so that they are inversely proportional and a difference is obtained between the output voltage amplitude of said signal normalizer before said change and that after said change.

6. The device of claim 5, wherein said signal generator comprises a device whereby the output voltage amplitude of said signal generator is amplified.

7. The device of claim 5, wherein said adjustment device controls the voltage amplitude of at least one of said two sine-wave signals, comprising a mechanism for controlling a determination of the amplification factor of said amplifier and a mechanism for controlling the determination of the output voltage amplification of said signal generator that has been adjusted by said adjustment device is determined.

8. The device of claim 5, wherein one of said two sine-wave signals is a synthetic signal of two or more sine-wave signals with the same frequency and said adjustment device controls the voltage amplitude of said two or more sine-wave signals.

9. An alternating current determination device comprising the device in claim 5 and a signal normalizer determined by said device, and is constructed such that said normalizer is placed in front of the input part of said alternating-current voltage determination device comprising said device and the alternating-current voltage is determined, and in that the amplification factor of said signal normalizer and the output voltage amplitude of said signal generator are each changed so that they are inversely proportional and the ratio of the amplification factor of said signal normalizer before and after said change is corrected by electronic calculation based on the difference that is produced between the output voltage amplitude of said signal normalizer before said change, and that after said change and the effect of said signal normalizer on the determination accuracy is eliminated.

10. An impedance determination device, which is constructed such that impedance is determined using the alternating-current voltage determination device in claim 9.

11. The device of claim 5, wherein said alternating-current voltage determination device comprises an analog-digital converter.

12. The device of claim 5, wherein said voltage amplifier effects its control by using a digital-analog converter.

13. The device of claim 5, wherein a direct digital synthesizer is provided for generating two or more signals and said device has a filter for removing higher harmonic waves generated by said synthesizer.

* * * * *